(12) United States Patent
Feng et al.

(10) Patent No.: US 12,183,744 B2
(45) Date of Patent: Dec. 31, 2024

(54) DISPLAY SUBSTRATE, DISPLAY DEVICE, DISPLAY SUBSTRATE, METHOD OF FORMING DISPLAY SUBSTRATE, AND METHOD OF FORMING DISPLAY DEVICE

(71) Applicants: Chengdu BOE Optoelectronics Technology Co., Ltd., Sichuan (CN); BOE Technology Group Co., Ltd., Beijing (CN)

(72) Inventors: Jingyi Feng, Beijing (CN); Yingsong Xu, Beijing (CN); Changlong Yuan, Beijing (CN); Zhenhua Zhang, Beijing (CN); Xilei Cao, Beijing (CN); Qian Ma, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 164 days.

(21) Appl. No.: 17/548,761

(22) Filed: Dec. 13, 2021

(65) Prior Publication Data
US 2022/0271059 A1   Aug. 25, 2022

(30) Foreign Application Priority Data
Feb. 22, 2021   (CN) .......................... 202110198675.1

(51) Int. Cl.
*H01L 27/12*   (2006.01)
*G02F 1/1333*   (2006.01)
*G02F 1/1362*   (2006.01)
*G02F 1/16756*   (2019.01)

(52) U.S. Cl.
CPC ...... *H01L 27/124* (2013.01); *G02F 1/133345* (2013.01); *G02F 1/136227* (2013.01); *G02F 1/16756* (2019.01); *H01L 27/1262* (2013.01); *G02F 2201/42* (2013.01)

(58) Field of Classification Search
CPC .......... G02F 1/133345; G02F 1/16756; G02F 1/136227
See application file for complete search history.

(56) References Cited

U.S. PATENT DOCUMENTS

2015/0311237 A1* 10/2015 Jo ..................... G02F 1/133345
257/72
2019/0121209 A1* 4/2019 Izawa ............... H01L 29/78633

* cited by examiner

*Primary Examiner* — Lauren Nguyen
(74) *Attorney, Agent, or Firm* — IPro, PLLC

(57) ABSTRACT

A display substrate, a display device, a method of forming a display substrate, and a method of forming a display device are provided. The display substrate includes: a first insulation structure, including a display area and a frame area, where the frame area is arranged around the display area, and at least one first groove is arranged in the first insulation structure of the display area; a first wiring layer arranged on the first insulating structure and covering a side surface and a bottom surface of the first groove; a second insulation structure arranged on the first wiring layer, where at least one first through-hole is formed in the second insulation structure of the frame area; a first conductive structure covering a part of an upper surface of the second insulating structure and at least a sidewall and a bottom surface of the first via-hole.

17 Claims, 10 Drawing Sheets

DISPLAY SUBSTRATE, DISPLAY DEVICE, DISPLAY SUBSTRATE, METHOD OF FORMING DISPLAY SUBSTRATE, AND METHOD OF FORMING DISPLAY DEVICE

CROSS-REFERENCE TO RELATED APPLICATIONS

This application claims priority to Chinese Patent Application No. 202110198675.1 filed in China on Feb. 22, 2021, the entire contents of which are hereby incorporated by reference.

TECHNICAL FIELD

The present disclosure relates to the field of display technologies, and in particular, to a display substrate, a display device, a method of forming a display substrate, and a method of forming a display device.

BACKGROUND

With the development of the technology, a larger screen ratio is pursued in the setting process of display devices such as mobile phones and televisions to narrow the frame. The shared width of present display device's lower frame is the biggest, and display device includes display substrate, and display substrate can divide into display area, wiring district and bending region, realizes the design of narrow frame through buckling the back of bending region to the display area among the correlation technique. Then, the wiring area and the bending area still occupy a large area when bending, resulting in that the frame can not be further narrowed.

SUMMARY

A display substrate is provided in the present disclosure, including:
  a first insulation structure, including a display area and a frame area, where the frame area is arranged around the display area, and at least one first groove is arranged in the first insulation structure of the display area;
  a first wiring layer arranged on the first insulating structure and covering a side surface and a bottom surface of the first groove;
  a second insulation structure arranged on the first wiring layer, where at least one first through-hole is formed in the second insulation structure of the frame area;
  a first conductive structure covering a part of an upper surface of the second insulating structure and at least a sidewall and a bottom surface of the first via-hole, and in contact with the first wiring layer under the first via-hole.

Optionally, the display substrate further includes a connection structure arranged at a side of the first insulating structure away from the second insulating structure and in contact with the first wiring layer on the bottom surface of the first groove.

Optionally, a depth of the first groove is less than or equal to a thickness of the first insulating structure, and when the depth of the first groove is less than the thickness of the first insulating structure, a part of the connection structure is arranged within the first insulating structure and in contact with the first wiring layer.

Optionally, at least one second groove is arranged in the first insulating structure of the display region, and the second groove and the first groove are arranged at intervals;
  the display substrate further includes a second wiring layer, where the second wiring layer is arranged on the first insulating structure and covers a side surface and a bottom surface of the second groove, a first insulating dielectric layer is further arranged between the second wiring layer and the first insulating structure, and the first insulating dielectric layer covers the first insulating structure and the first wiring layer;
  at least one second through-hole is further formed in the second insulating structure of the frame area, and the second through-hole and the first through-hole are arranged at intervals;
  a second conductive structure covering the part of the upper surface of the second insulating structure and at least covering a sidewall and a bottom surface of the second via-hole, and in contact with the second wiring layer under the second via-hole.

Optionally, the first conductive structure includes a first conductive layer filling the first via-hole.

Optionally, the first conductive structure includes a first conductive layer and a second conductive layer arranged in a stacked manner, the first conductive layer is in contact with the second conductive layer within the first via-hole, and a second insulating dielectric layer is arranged between the first conductive layer and the second conductive layer on the second insulating structure.

Optionally, a third conductive layer is further arranged between the first conductive layer and the second conductive layer, the first conductive layer, the third conductive layer and the second conductive layer in the first via-hole are in contact with each other, a third insulating dielectric layer is arranged between the first conductive layer and the third conductive layer on the second insulating structure, and the second insulating dielectric layer is arranged between the third conductive layer and the second conductive layer.

A display device including the display substrate hereinabove is further provided in the present disclosure.

Optionally, the display device further includes a chip on film layer and a circuit board, the chip on film layer being in contact with the connection structure in the display substrate, the first wiring layer in the display substrate being bound to the circuit board through the connection structure and the chip on film layer.

Optionally, the display device further includes a connection structure arranged at a side of the first insulating structure away from the second insulating structure and in contact with the first wiring layer on the bottom surface of the first groove.

Optionally, a depth of the first groove is less than or equal to a thickness of the first insulating structure, and when the depth of the first groove is less than the thickness of the first insulating structure, a part of the connection structure is arranged within the first insulating structure and in contact with the first wiring layer.

Optionally, at least one second groove is arranged in the first insulating structure of the display region, and the second groove and the first groove are arranged at intervals;
  the display substrate further includes a second wiring layer, where the second wiring layer is arranged on the first insulating structure and covers a side surface and a bottom surface of the second groove, a first insulating dielectric layer is further arranged between the second wiring layer and the first insulating structure, and the first insulating dielectric layer covers the first insulating structure and the first wiring layer;

at least one second through-hole is further formed in the second insulating structure of the frame area, and the second through-hole and the first through-hole are arranged at intervals;

a second conductive structure covering the part of the upper surface of the second insulating structure and at least covering a sidewall and a bottom surface of the second via-hole, and in contact with the second wiring layer under the second via-hole.

A method of forming a display substrate is further provided in the present disclosure, including:

providing a first insulating structure, where the first insulating structure includes a display area and a frame area, and the frame area is arranged around the display area;

etching the first insulation structure to form at least one first groove in the first insulation structure of the display area;

forming a first wiring layer on the first insulating structure, the first wiring layer covering a part of the first insulating structure and a side surface and a bottom surface of the first groove;

forming a second insulating structure on the first wiring layer;

etching the second insulating structure to form at least one first through-hole in the second insulating structure of the frame area; and forming a first conductive structure which covers the part of the upper surface of the second insulating structure and at least a side wall and a bottom surface of the first through-hole and is in contact with the first wiring layer under the first through-hole.

Optionally, the first insulating structure is arranged on a substrate, the method further includes:

peeling off the substrate; and forming the connecting structure, where the connecting structure is arranged on a side of the first insulating structure away from the second insulating structure and is in contact with the first wiring layer on the bottom surface of the first groove.

Optionally, the depth of the first groove is less than or equal to the thickness of the first insulating structure, and when the depth of the first groove is less than the thickness of the first insulating structure, the forming the connection structure includes:

etching the surface at a side, away from the second insulating structure, of the first insulating structure to expose the first wiring layer in the first groove;

arranging the connection structure, where a part of the connection structure is arranged in the first insulating structure and in contact with the first wiring layer.

Optionally, prior to the etching the surface at the side, away from the second insulating structure, of the first insulating structure to expose the first wiring layer in the first groove, the method further includes:

depositing an insulating film layer, where the insulating film layer covers the side of the first insulating structure away from the second insulating structure; and etching the insulation film layer to at least expose the first insulation structure at the position of the first groove.

Optionally, subsequent to the forming the first wiring layer on the first insulating structure, the method further includes:

depositing a first insulating dielectric layer, where the first insulating dielectric layer covers the first insulating structure and the first wiring layer;

etching the first insulating dielectric layer and the first insulating structure to form at least one second groove in the first insulating structure of the display area, where the second groove and the first groove are arranged at intervals;

forming a second wiring layer, where the second wiring layer covers the first insulating dielectric layer and covers the side surface and the bottom surface of the second groove;

etching the second insulating structure to form at least one second through-hole in the second insulating structure of the frame area, where the second through-hole and the first through-hole are arranged at intervals; and forming a second conductive layer which covers part of the upper surface of the second insulating structure and at least covers the side wall and the bottom surface of the second through-hole and is in contact with the second wiring layer under the second through-hole.

Optionally, the forming conductive structures includes:

depositing a first conductive layer covering a part of the upper surface of the second insulating structure and at least a sidewall and a bottom surface of the first via-hole, and in contact with the first wiring layer under the first via-hole;

depositing a second insulating dielectric layer, where the second insulating dielectric layer covers the first conducting layer on the second insulating structure; and depositing a second conducting layer, where the second conducting layer covers the second insulating dielectric layer and is in contact with the first conducting layer in the first through-hole.

Optionally, subsequent to the depositing the second insulating dielectric layer and prior to the depositing the second conductive layer, the method further includes: depositing a third conducting layer and a third insulating dielectric layer in sequence, where the third conducting layer covers the second insulating dielectric layer and is in contact with the first conducting layer and the second conducting layer in the first through-hole, and the third insulating dielectric layer covers the second conducting layer on the second insulating dielectric layer.

A method of forming a display device is further provided in the present disclosure, wherein the display device comprises a display substrate manufactured using the method of forming a display substrate hereinabove.

BRIEF DESCRIPTION OF THE DRAWINGS

The scope of the present disclosure will be better understood from the following detailed description of exemplary embodiments when read in conjunction with the accompanying drawings. Wherein the attached figures are included.

DETAILED DESCRIPTION

In order to make the objects, technical solutions and advantages of the present disclosure more apparent, the following detailed description of the implementation method of the present disclosure is provided with the accompanying drawings and embodiments, so that how to apply the technical means to solve the technical problems and achieve the technical effects can be fully understood and implemented.

Figure 1:
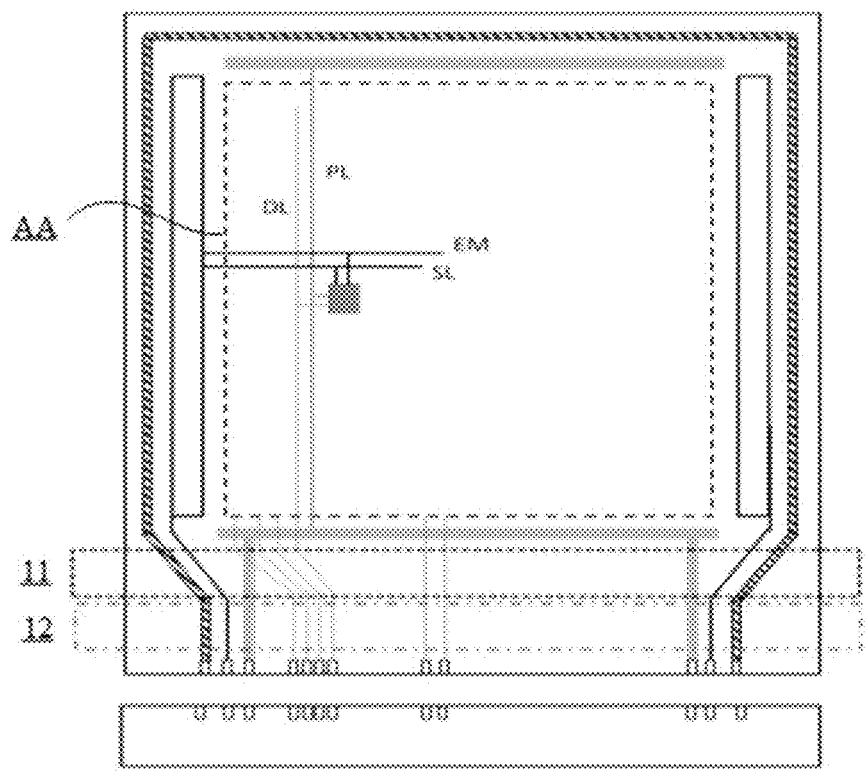
FIG. 1 is a schematic diagram of a wiring layout of a display substrate in the related art.
Figure 2:
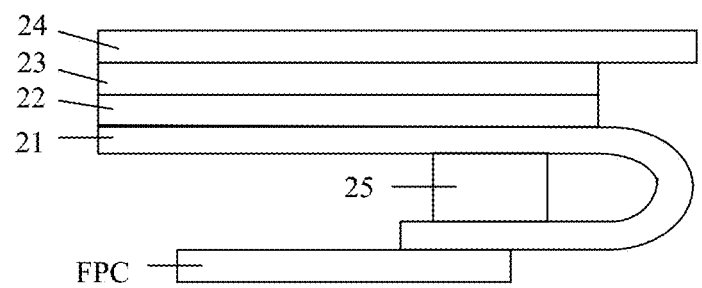
FIG. 2 is a schematic diagram of a display device using a related narrow bezel design method.

With the development of the technology, a larger screen ratio is pursued in the setting process of display devices such as mobile phones and televisions to narrow the frame. At present, the width occupied by the lower frame of a display device is the largest, the display device includes a display substrate, as shown in FIG. 1, FIG. 1 shows a schematic layout of routing lines of a display substrate in related art, the routing lines of the display substrate are basically all arranged on the same layer on the substrate, the display substrate can be divided into a display area AA, a wiring area 11 and a bending area 12, dl (data line), pl (power line), pulse signal EM and sl (scan line) signal lines may be arranged in the display area AA, signal data lines led out from the display area AA are led to connection terminals through the wiring area 11 and the bending area 12 to achieve connection with the outside, in order to achieve design of a narrow frame, a flexible substrate is usually employed in related art, and routing is performed on a lead-out layer of the signal data lines on the flexible substrate, and the bending area 12 is bent to the back of the display area AA to achieve design of the narrow frame, as shown in FIG. 2, FIG. 2 is a schematic structural diagram of a display device using a narrow frame design method in the related art, where the display device may include a display substrate 21, a polarizer layer 22, a touch component layer 23, a glass cover 24, and a bonding pad 25, and the display substrate 21 may be connected to an FPC located on the back of the display substrate 21 after being bent. The layout of the wiring region 11 and the bending region 12 of the display substrate 21 still needs to occupy a large space, so that the frame cannot be further narrowed.

Figure 3:
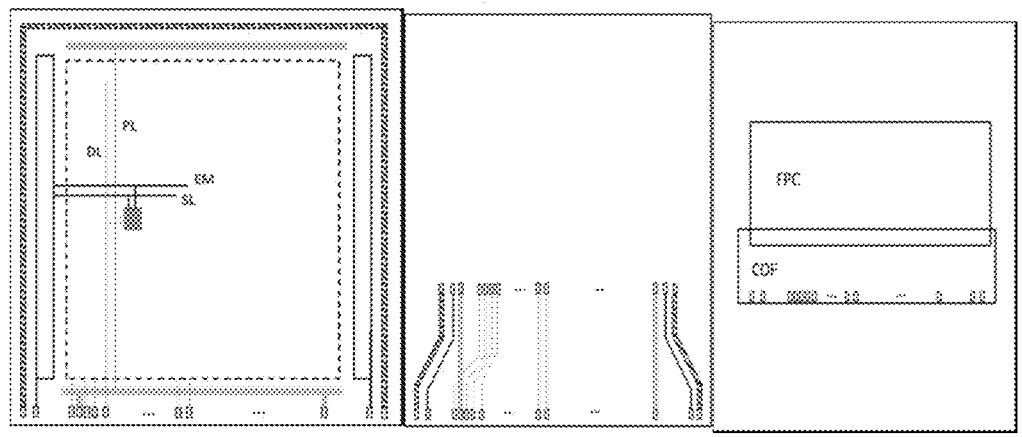
FIG. 3 is a schematic diagram of a layout of traces on a display substrate according to an embodiment of the disclosure.
Figure 4:
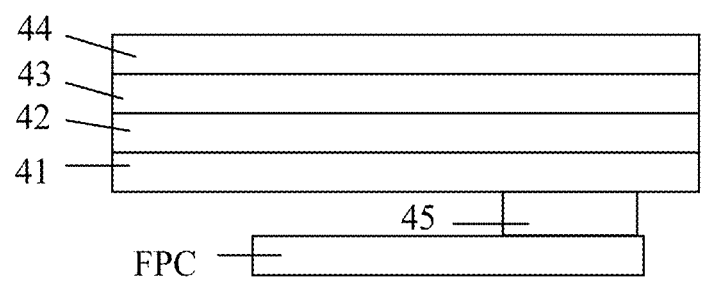
FIG. 4 is a schematic diagram of a structure of a display device according to an embodiment of the present disclosure.

In view of this, the present disclosure provides a display substrate, as shown in FIG. 3 and FIG. 4, FIG. 3 shows a schematic layout diagram of traces of the display substrate provided by the embodiment of the present disclosure, and the traces are arranged on different layers, so as to effectively improve the screen occupation ratio of a display area, specifically, as shown in the left diagram of FIG. 3, after different types of signal lines in an AA area shown by a dashed line frame are led out, fanout wiring is not performed on a signal line lead-out layer, and the traces are led to a lower layer of the signal line lead-out layer through via-holes to perform fanout wiring, as shown in the middle diagram of FIG. 3; and finally, the fanout wiring is led to the back of the display substrate through the through-holes, pins are made on the back of the display substrate, and the fanout wiring is bound with the FPC through the COF layer as shown in the right diagram in the FIG. 3, so that the wiring area is effectively reduced on the signal wire leading-out layer. FIG. 4 shows a schematic structural diagram of a display device provided in the embodiment of the present disclosure, where the display device may include a display substrate 41, a polarizer layer 42, a touch component layer 43, and a glass cover plate 44, and the display substrate 41 is connected to an FPC through a connector 45 on a back surface thereof, so as to avoid a bending area, and further implement narrowing of a frame.

The display substrate provided by the embodiment of the disclosure includes a first insulation structure provided with at least one first groove in a display region, a first wiring layer arranged on the first insulation structure and covering a side surface and a bottom surface of the first groove, a second insulation structure arranged on the first wiring layer and provided with at least one first through-hole in a frame region, and a first conductive structure covering a part of an upper surface of the second insulation structure and at least covering a side wall and a bottom surface of the first through-hole and contacting the first wiring layer under the first through-hole. Through setting up first wiring layer between first insulation construction and second insulation construction, be contacted through first through-hole and first wiring layer by first conductive structure, and then can realize being connected with outside through first wiring layer, effectively reduced the wiring district and avoided the appearance in district of buckling, very big realization the narrowing of frame.

Figure 5:
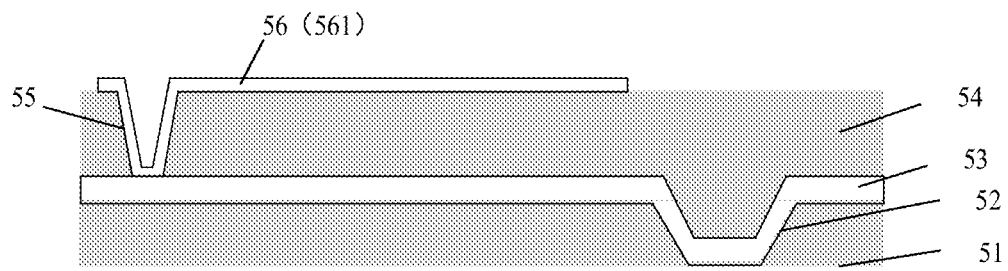
FIG. 5 is a schematic cross-sectional view of a display substrate according to an embodiment of the disclosure.

For the display substrate provided in the embodiment of the present disclosure, please refer to FIG. 5, FIG. 5 shows a schematic cross-sectional structure diagram of the display substrate provided in the embodiment of the present disclosure, and the display substrate may include:

the first insulating structure 51, the first insulating structure 51 including a display area and a frame area, the frame area being arranged around the display area, at least one first groove 52 being arranged in the first insulating structure 51 of the display area;

a first wiring layer 53, the first wiring layer 53 being arranged on the first insulating structure 51 and covering the side and bottom surfaces of the first groove 52;

a second insulating structure 54, the second insulating structure 54 being arranged on the first wiring layer 53, at least one first via-hole 55 being arranged in the second insulating structure 54 of the frame region;

and a first conductive structure 56, wherein the first conductive structure 56 covers part of the upper surface of the second insulating structure 54 and at least covers the sidewall and the bottom surface of the first via-hole 55, and contacts the first wiring layer 53 under the first via-hole 55.

The first insulating structure 51 may include at least one flexible substrate layer, the second insulating structure 56 may also include at least one flexible substrate layer, and in other embodiments, the second insulating structure 56 may further include at least one insulating material layer covering the flexible substrate layer. The flexible substrate layer may be formed of Polyimide (PI), and the insulating material layer may be formed of silicon oxide, silicon nitride, silicon oxynitride, or the like.

Figure 6:
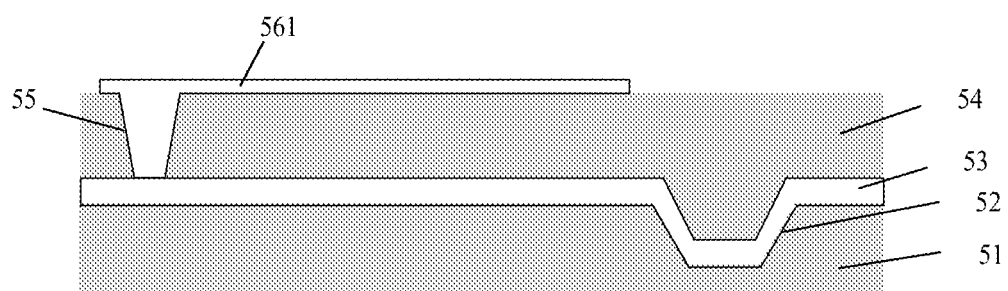
FIG. 6 is a schematic cross-sectional view of a display substrate with a depth less than the thickness of the first insulating structure.

In some embodiments, the depth of the first groove 52 may be equal to the thickness of the first insulating structure 51; in another embodiment, the depth of the first groove 52 may be further smaller than the thickness of the first insulating structure 51, which can be specifically described with reference to FIG. 6, and FIG. 6 shows a schematic cross-sectional structure of a display substrate provided with a depth smaller than the thickness of the first insulating structure. In some embodiments, the thickness of the first insulating structure 51 may be 10 micrometers, and the depth of the first groove 52 may be 6 to 9 micrometers.

In the embodiment of the present disclosure, the first wiring layer 53 may include a plurality of fan-out traces extending from the frame region to the display region, where the fan-out traces may be in contact with the first conductive structures 56 through the corresponding first through-holes 55; in the display area, in order to realize an electrical connection with the outside, for example, a connection with an external driving chip, the traces covering the bottom surface of the first groove 52 may be used as connection terminals, and the horizontal spacing between the fan-out traces is reduced, and in some embodiments, the spacing between the projections of the connection terminals corresponding to the fan-shaped traces on the surface of the second insulating structure 54 is smaller than the spacing between the first through-holes 55 in the same direction, as shown in FIG. 3. Therefore, by arranging the first wiring layer 53 between the first insulating structure 51 and the second insulating structure 54 and arranging the first through-holes 55 on the second insulating structure 54, a larger horizontal interval between the first through-holes 55 can be maintained, and the difficulty in the process of etching through-holes on the second insulating structure 54 is effectively reduced.

In some embodiments, the first conductive structure 56 may include a first conductive layer 561 covering a part of the upper surface of the second insulating structure 54 and covering the sidewall and bottom surface of the first via-hole 55, as shown in FIG. 5. Among them, the first conductive structure 56 may be connected to a plurality of signal types, and as an example, the first conductive structure 56 may be connected to VDD, VSS, GOA or data signals in the display region.

Figure 7:
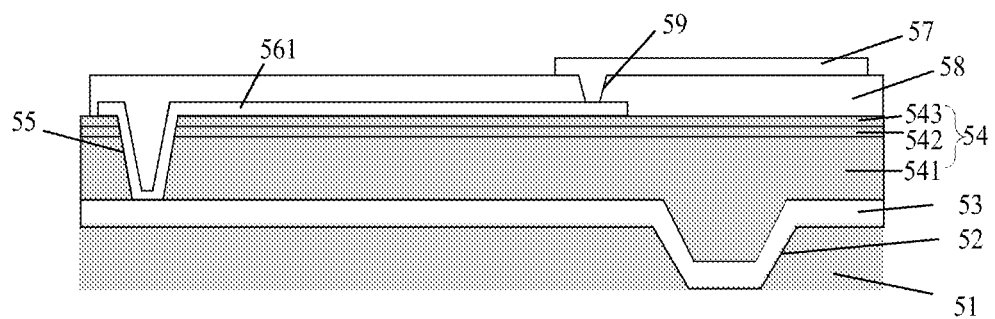
FIG. 7 is a schematic cross-sectional view of a display substrate provided with a first conductive layer according to an embodiment of the disclosure.

In some embodiments, referring to FIG. 7, FIG. 7 shows a schematic cross-sectional structure of a display substrate provided with a first conductive layer according to an embodiment of the present disclosure, the first conductive layer 561 may be a first gate line layer, and the second insulating structure 54 may include a PI layer 541, a buffer layer 542, and a first gate insulating layer 543, which are sequentially stacked. In order to realize the connection with the wires in the display area, the display substrate may further be provided with a lead-out wire 57, and the lead-out wire 57 may be used as a lead-out wire for VDD, VSS, GOA or data signals in the display area. In addition, an interlayer dielectric layer 58 covering the first conductive layer 561 and the first gate insulating layer 543 in a conformal manner may be further provided, a third through-hole 59 is arranged on the interlayer dielectric layer 58, the lead-out trace 57 may cover part of the interlayer dielectric layer 58 and fill the third through-hole 59, and contact the first conductive layer 561 under the third through-hole 59, so as to lead the data signal line in the display area to the first wiring layer 53 through the first conductive layer 561 and the first through-hole 55.

The buffer layer 542, the first gate insulating layer 543, and the interlayer dielectric layer 58 may all be made of silicon oxide, silicon nitride, or silicon oxynitride, and in some embodiments, the buffer layer 542, the first gate insulating layer 543, and the interlayer dielectric layer 58 may be made of the same material; in other embodiments, the buffer layer 542, the first gate insulating layer 543, and the interlayer dielectric layer 58 may be formed of different materials.

In some embodiments, the first conductive structure 56 may include a first conductive layer 561, and the first conductive layer 561 fills the first through-hole 55, as shown in FIG. 6. The first conductive layer 561 may be formed in synchronization with a gate layer in the display region and may also be formed in synchronization with a source/drain layer in the display region, which will be described below based on the first conductive layer 561 formed in synchronization with the source/drain layer in the display region. The second insulating structure 54 may include a PI layer, a buffer layer, a first gate insulating layer, a second gate insulating layer, and an interlayer dielectric layer, which are sequentially stacked, and an upper surface of the first conductive layer 561 may be at the same level as an upper surface of the source/drain layer in the display area. So set up, walk the line when display area and frame district are connected simple.

Figure 8:
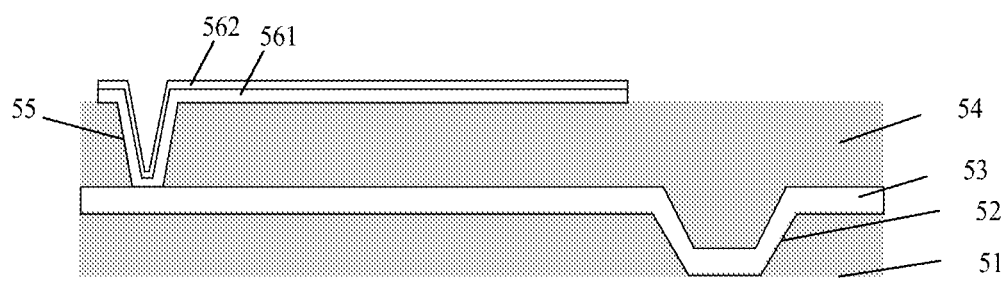
FIG. 8 is a schematic cross-sectional structural diagram of a conductive structure formed by multiple conductive layers according to an embodiment of the disclosure.

The conductive structure may further include multiple conductive layers, and in some embodiments, referring to FIG. 8, FIG. 8 is a schematic diagram of a cross-sectional structure of a conductive structure formed by multiple conductive layers according to an embodiment of the present disclosure. The first conductive structure 56 may include a first conductive layer 561 and a second conductive layer 562 stacked, and the first conductive layer 561 and the second conductive layer 562 are in contact in the first via-hole 55, where the first conductive layer 561 and the second conductive layer 562 may be in partial contact or full contact in the first via-hole 55; a second insulating dielectric layer (not shown) is arranged between the first conductive layer 561 and the second conductive layer 562 on the second insulating structure 54, wherein the first conductive layer 561 may serve as a conductive layer for auxiliary connection.

Figure 9:
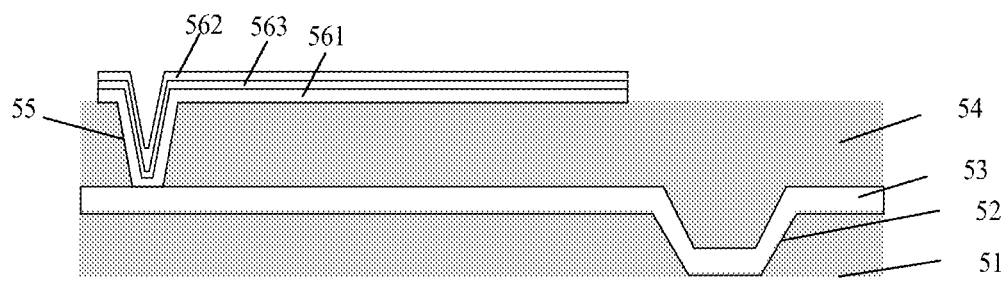
FIG. 9 is a schematic cross-sectional view of another conductive structure formed by multiple conductive layers according to an embodiment of the disclosure.

In other embodiments, referring to FIG. 9, FIG. 9 is a schematic diagram of a cross-sectional structure of another conductive structure formed by multiple conductive layers according to an embodiment of the present disclosure. In the conductive structure, a third conductive layer 563 may be further arranged between the first conductive layer 561 and the second conductive layer 562, the first conductive layer 561, the third conductive layer 563, and the second conductive layer 562 in the first through-hole 55 are in contact, a third insulating dielectric layer (not shown in the figure) is arranged between the first conductive layer 561 and the third conductive layer 563 on the second insulating structure 54, and a second insulating dielectric layer (not shown in the figure) is arranged between the third conductive layer 563 and the second conductive layer 562. It should be noted that, in other embodiments, in order to reduce the depth of the etched via-hole, a plurality of third conductive layers 563 may also be arranged as conductive layers for assisting the connection.

The first conductive layer 561 may be a first gate line layer, the second conductive layer 562 may be a source/drain wiring layer, the third conductive layer 563 may be a second gate line layer, the second insulating dielectric layer may be an interlayer dielectric layer, the third insulating dielectric layer may be a second gate insulating layer, and the second insulating dielectric layer, the third insulating dielectric layer, and the interlayer dielectric layer may be made of silicon oxide, silicon nitride, or silicon oxynitride.

Figure 10A:
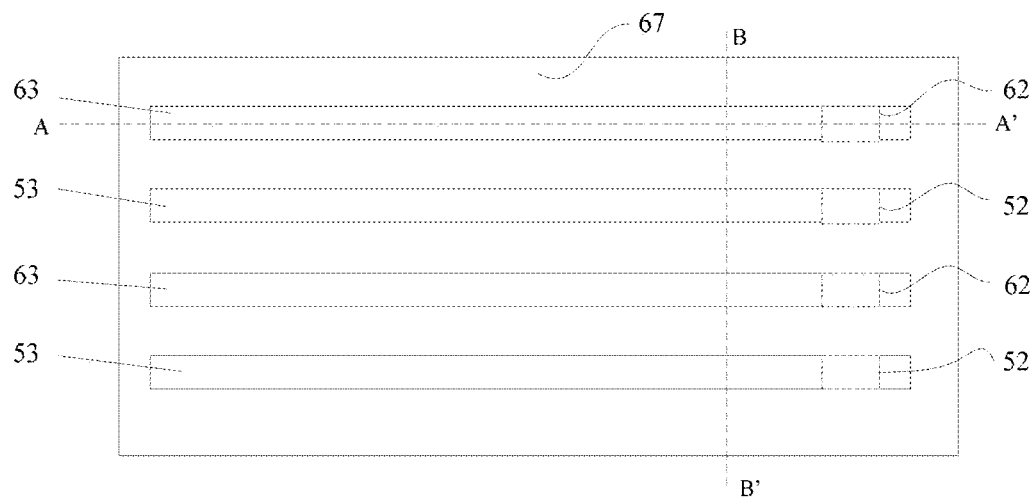
FIG. 10A shows a schematic top view structure of a display substrate provided with a first wiring layer and a second wiring layer according to an embodiment of the disclosure.
Figure 10B:
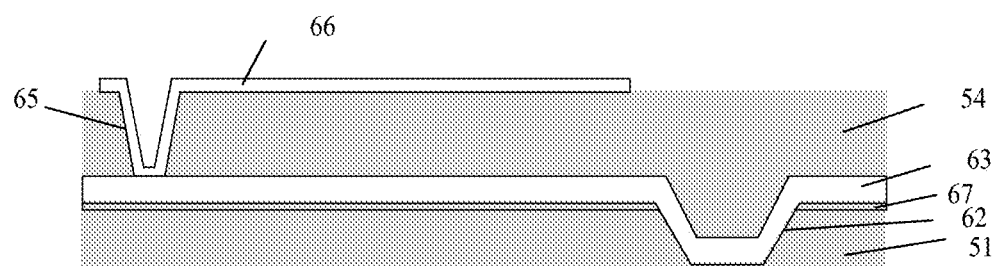
FIG. 10B is a schematic cross-sectional view of the display substrate provided with the second wiring layer taken along the dotted line A-A' in FIG. 10A.
Figure 11:
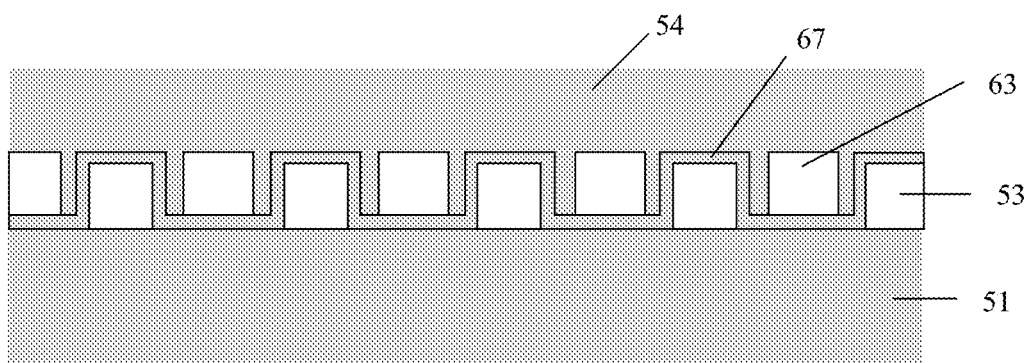
FIG. 11 is a schematic cross-sectional structural view of a display substrate provided with a first wiring layer and a second wiring layer, taken along the dashed line B-B' in FIG. 10A according to an embodiment of the disclosure.

In the embodiment of the present disclosure, when the types of the data signals led out from the display area are different, the different types of data signals are respectively connected to the different conductive structures, and the connection with the corresponding wires in the wiring layer is realized through the different through-holes. Thus, referring to FIG. 10A and FIG. 10B, FIG. 10A shows a schematic top view structure of a display substrate provided with a first wiring layer and a second wiring layer according to an embodiment of the disclosure, and FIG. 10B shows a schematic cross-sectional structure of the display substrate provided with the second wiring layer along a dashed line a-a' in FIG. 10A. At least one second groove 62 is further arranged in the first insulating structure 51 of the display area, and the second groove 62 and the first groove 52 are arranged at an interval; the display substrate further includes a second wiring layer 63, the second wiring layer 63 is arranged on the first insulating structure 51 and covers the side surface and the bottom surface of the second groove 62, and a first insulating dielectric layer 67 is further arranged between the second wiring layer 63 and the first insulating structure 51 and covers the first insulating structure 51 and the first wiring layer 53, specifically referring to FIG. 11, where FIG. 11 shows a schematic cross-sectional structure of the display substrate provided with the first wiring layer and the second wiring layer, which is obtained along a dashed line B-B' in FIG. 10B according to an embodiment of the disclosure; at least one second through-hole 65 is further arranged in the second insulating structure 54 of the frame area, and the second through-hole 65 and the first through-hole 55 are arranged at intervals; and a second conductive structure 66, wherein the second conductive structure 66 covers a part of the upper surface of the second insulating structure 54 and at least covers the sidewall and the bottom surface of the second via-hole 65, and contacts the second wiring layer 63 under the second via-hole 65, and the second conductive structure 66 and the first conductive structure 56 connect different types of signals. The first insulating dielectric layer 67 may be formed of silicon oxide, silicon nitride, aluminum oxide, or the like.

It should be noted that the second groove 62 may be arranged in the same manner as the first groove 61, the second wiring layer 63 may be arranged in the same manner as the first wiring layer 53, and the second conductive structure 66 may be arranged in the same manner as the first conductive structure 56.

Figure 12:
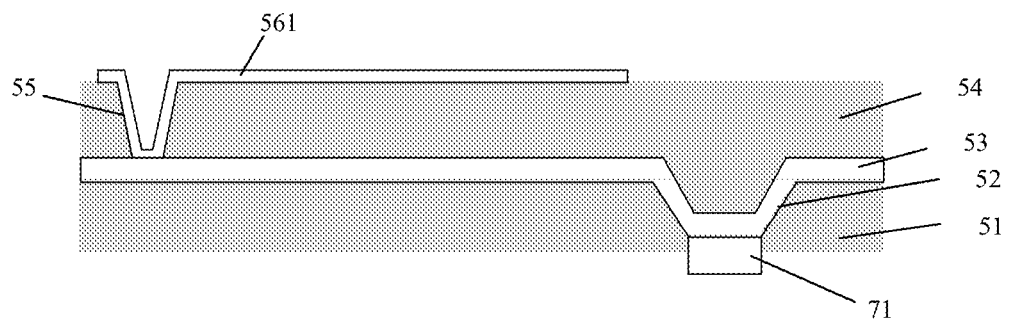
FIG. 12 is a schematic cross-sectional view of another display substrate according to an embodiment of the disclosure.

In an embodiment of the present disclosure, the display substrate may further include a connection structure 71, specifically, referring to FIG. 12, FIG. 12 is a schematic cross-sectional structure diagram of another display substrate according to an embodiment of the present disclosure, and the connection structure 71 is arranged on a side of the first insulation structure 51 away from the second insulation structure 54 and contacts the first wiring layer 53 on the bottom surface of the first groove 52.

In some embodiments, the connection structure 71 may contact the chip on film layer 8 for connection with an external circuit, and the first wiring layer 53 is bound to the circuit board through the connection structure 71 and the chip on film layer, which is described in detail below with reference to FIG. 14 and the display device. The connection structure 71 may be an anisotropic conductive adhesive layer.

Figure 13:
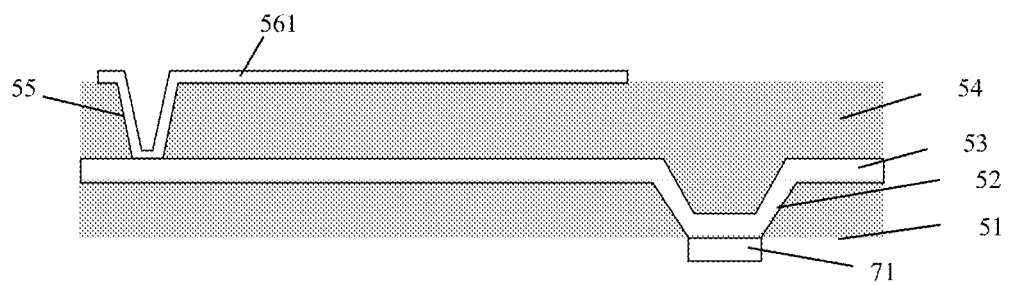
FIG. 13 is a schematic diagram of a display substrate with a connection structure arranged on a surface of one side of a first insulation structure according to an embodiment of the disclosure.

For different arrangement manners of the first groove 52, the connection structure 71 also needs to be arranged in different manners, in some embodiments, the depth of the first groove 52 is smaller than the thickness of the first insulation structure 51, and a part of the connection structure 71 is arranged in the first insulation structure 51 to contact with the first wiring layer 53, as can be specifically seen in FIG. 12; in other embodiments, the depth of the first groove 52 is equal to the thickness of the first insulating structure 51, and the connection structure 71 is arranged on a surface of the first insulating structure 51 on a side away from the second insulating structure 54, specifically referring to FIG. 13, where FIG. 13 shows a schematic diagram of a display substrate in which the connection structure provided in the embodiment of the disclosure is arranged on a surface of the first insulating structure on a side.

The display substrate provided by the embodiment of the present disclosure includes a first insulating structure 51 provided with at least one first groove 52 in a display region, a first wiring layer arranged on the first insulating structure 51 and covering a side surface and a bottom surface of the first groove 52, a second insulating structure 54 arranged on the first wiring layer 53 and provided with at least one first via-hole 55 in a frame region, and a first conductive structure 56 covering a part of an upper surface of the second insulating structure 54 and at least covering a sidewall and a bottom surface of the first via-hole 55 and contacting the first wiring layer 53 under the first via-hole 55. Through setting up first wiring layer 53 between first insulation structure 51 and second insulation structure 54, contact with first wiring layer 53 through first through-hole 55 by first conductive structure 56, and then can realize being connected with outside through first wiring layer 53, effectively reduced the wiring district and avoided the appearance of kink district, very big realization the narrowing of frame.

Another aspect of the present disclosure also provides a display device including the display substrate as described above.

Figure 14:
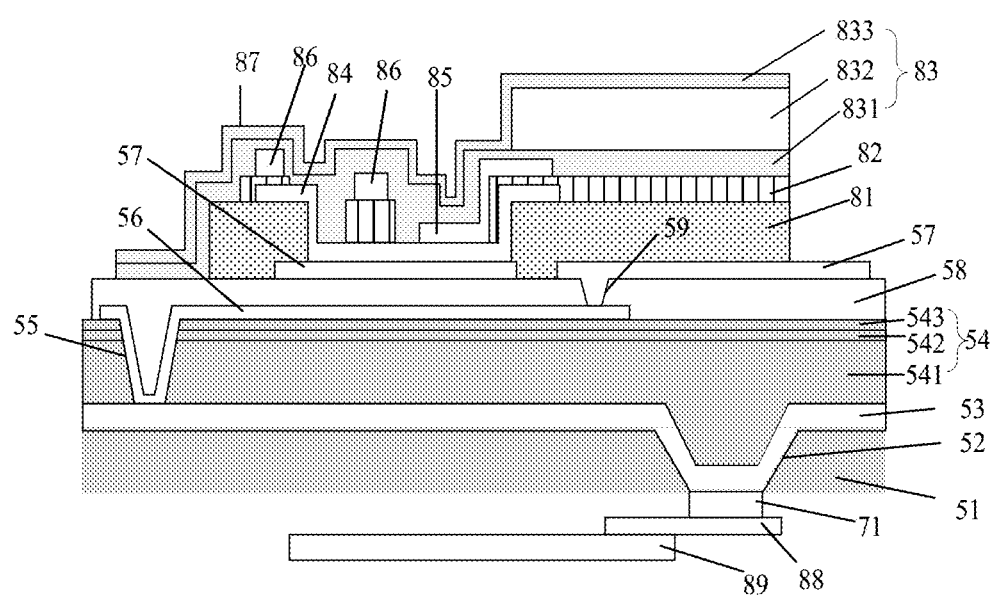
FIG. 14 is a schematic view showing a partial cross-sectional structure of a display device.

FIG. 14 is a schematic diagram of a partial cross-sectional structure of a display device provided in this embodiment, and FIG. 14 is only an example, and in actual setting, different structural layers may be set in both the display area and the frame area of the display substrate according to actual needs, and the display device is not limited to the example in FIG. 14.

As shown in FIG. 14, a driving circuit layer (not shown), a planarization layer 81, a light emitting device (not shown), a pixel defining layer 82, and an encapsulation layer 83 may be arranged in the display region, the driving circuit layer may include a driving transistor and a capacitor structure, the light emitting device may include a first electrode layer 84, a light emitting layer, and a second electrode layer 85, and the encapsulation layer 83 may include a first encapsulation layer 831, a second encapsulation layer 832, and a third encapsulation layer 833. A flat layer 81, a first electrode layer 84 partially covering the flat layer 81 and the lead-out trace 57, a pixel definition layer 82 arranged on the first electrode layer 84 and the flat layer 81, a second electrode layer 85 arranged on the first electrode layer 84 and the pixel definition layer 82, a support structure 86 partially covering the pixel definition layer 82, and a blocking structure 87 may also be arranged on the first conductive structure 56 in the frame region of the display substrate.

In other embodiments, the display device may further include a chip on film layer 88 and a circuit board 89, the chip on film layer 88 is in contact with the connection structure 71 in the display substrate, and the first wiring layer 53 in the display substrate is bound with the circuit board 89 through the connection structure 71 and the chip on film layer 88, wherein, in some embodiments, the circuit board 89 may be a flexible circuit board FPC.

It should be noted that, in the embodiment of the present disclosure, the arrangement modes of the driving circuit layer, the planarization layer, the light emitting device, the pixel defining layer, and the encapsulation layer of the display device are not particularly limited, and may be arranged in a conventional manner, and are not described herein again for brevity.

In addition, a preparation method of the display substrate is correspondingly provided in the embodiment of the present disclosure.

Figure 15:
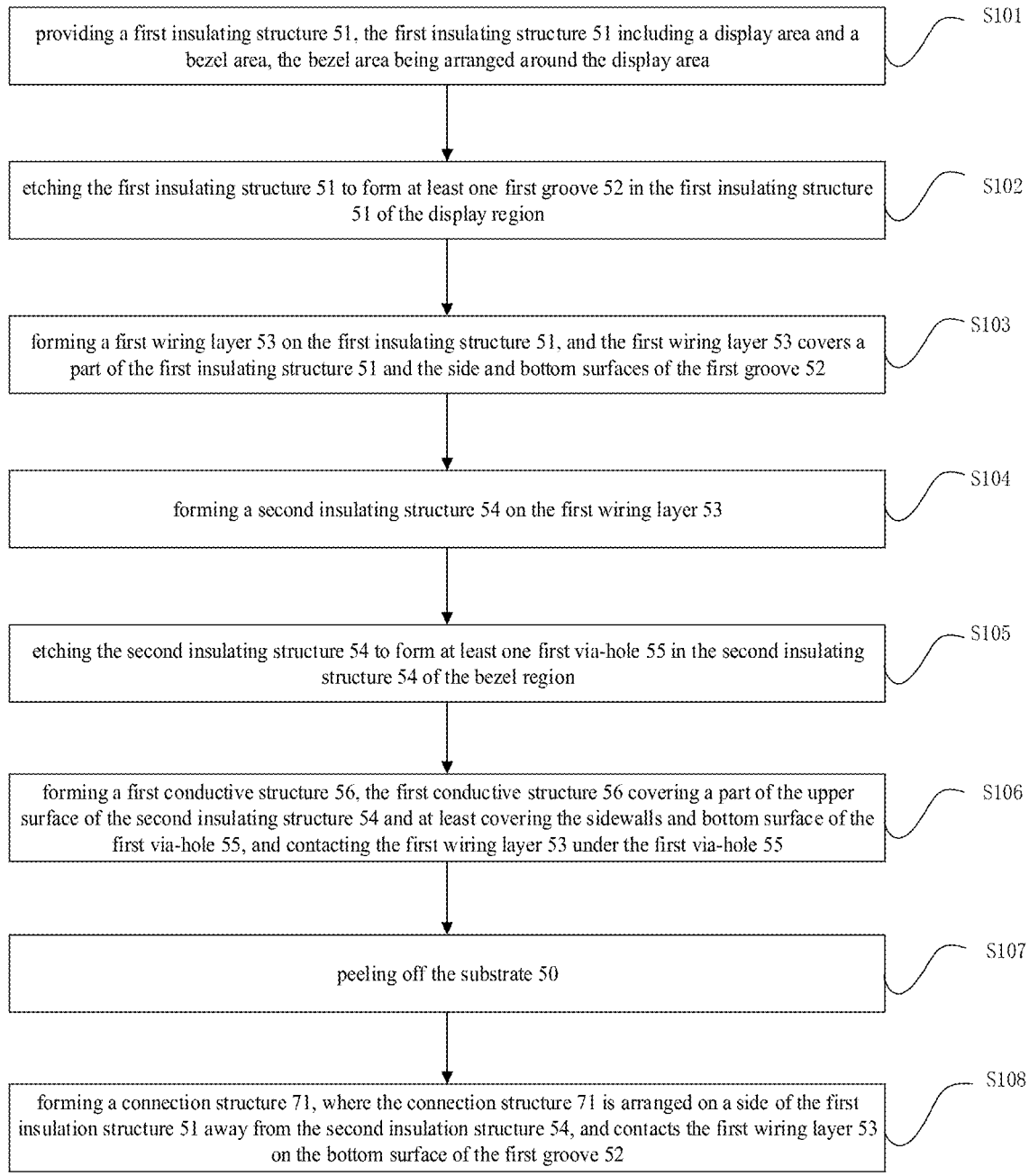
FIG. 15 is a schematic flow chart of a method of forming a display substrate according to an embodiment of the present disclosure.

Referring to FIG. 15, FIG. 15 is a schematic flow chart of a method of forming a display substrate according to an embodiment of the present disclosure, which includes:

Step S101: providing a first insulating structure 51, the first insulating structure 51 including a display area and a bezel area, the bezel area being arranged around the display area.

Step S102: etching the first insulating structure 51 to form at least one first groove 52 in the first insulating structure 51 of the display region.

Step S103: forming a first wiring layer 53 on the first insulating structure 51, and the first wiring layer 53 covers a part of the first insulating structure 51 and the side and bottom surfaces of the first groove 52.

Step S104: forming a second insulating structure 54 on the first wiring layer 53.

Step S105: etching the second insulating structure 54 to form at least one first via-hole 55 in the second insulating structure 54 of the bezel region.

Step S106: forming a first conductive structure 56, the first conductive structure 56 covering a part of the upper surface of the second insulating structure 54 and at least covering the sidewalls and bottom surface of the first via-hole 55, and contacting the first wiring layer 53 under the first via-hole 55.

The first insulating structure 51 may include at least one flexible base layer, the flexible base layer may be formed by Polyimide (PI), when the first insulating structure 51 is a flexible base layer, the first insulating structure 51 may be arranged on the substrate 50, and the substrate 50 may be a hard substrate such as glass to support the first insulating structure 51.

Figure 16:
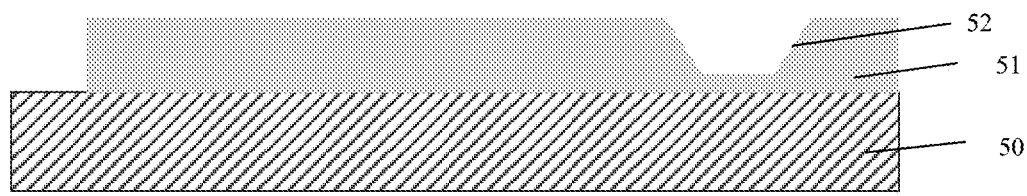
FIG. 16 is a schematic cross-sectional view of a first insulation structure according to an embodiment of the disclosure.

At least one groove 52 may be formed in the first insulating structure 51 of the display region using a dry etching or wet etching process in step S102. In some embodiments, the depth of the first groove 52 may be equal to the thickness of the first insulating structure 51, as can be seen in particular in FIG. 5; in other embodiments, the depth of the first groove 52 may be smaller than the thickness of the first insulating structure 51, specifically referring to FIG. 16, where FIG. 16 shows a schematic cross-sectional structure of the first insulating structure provided in the embodiment of the disclosure.

Figure 17:
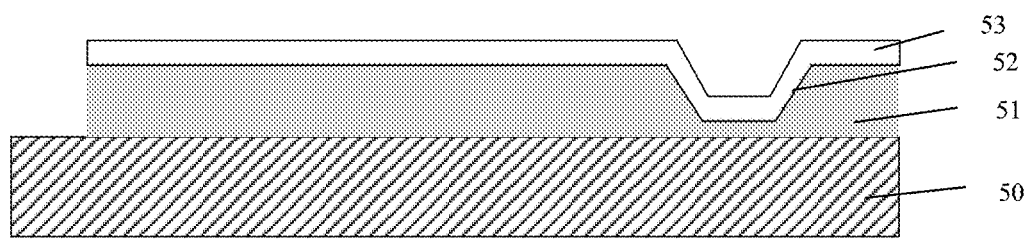
FIG. 17 is a schematic cross-sectional structure diagram of a first insulating structure formed with a first wiring layer according to an embodiment of the present disclosure.

Step S103 may specifically be to deposit a conductive layer by using a coating process, a magnetron sputtering process, a plasma deposition process, or the like, and then etch the conductive layer by using an etching process to form the first wiring layer 53 of the target pattern, as shown in FIG. 17, where FIG. 17 shows a schematic cross-sectional structure diagram of the first insulating structure formed with the first wiring layer according to the embodiment of the present disclosure.

Figure 18:
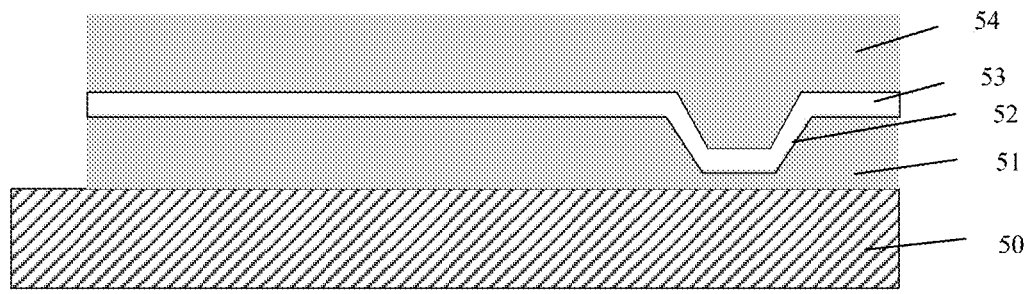
FIG. 18 illustrates a schematic cross-sectional structure of an embodiment of the disclosure provided with a second insulating structure formed thereon.

In step S104, a conventional deposition process such as coating, physical vapor deposition or chemical vapor deposition may be employed to form the second insulating structure 54 on the first wiring layer 53, as shown in FIG. 18, where FIG. 18 is a schematic cross-sectional view of the second insulating structure formed according to the embodiment of the present disclosure.

Figure 19:
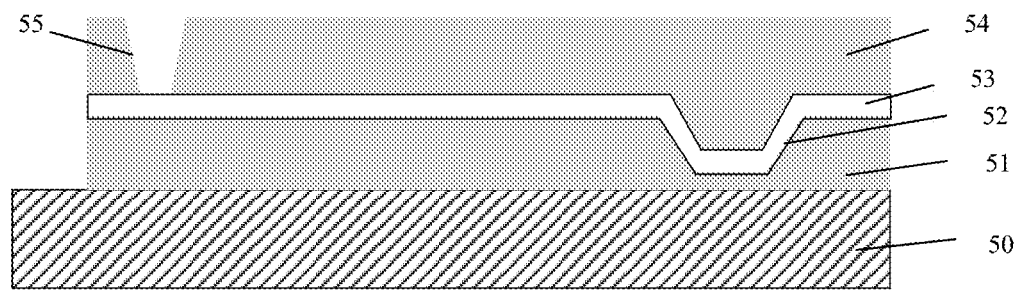
FIG. 19 is a schematic cross-sectional view of a first via-hole arranged in a second insulating structure according to an embodiment of the disclosure.

In step S105, a dry etching process or a wet etching process may be used to etch the second insulating structure 54 in the frame region, so as to form at least one first via-hole 55 on the second insulating structure 54, where the first via-hole 55 may expose a part of the first wiring layer 53, as shown in FIG. 19, and FIG. 19 shows a schematic cross-sectional structure diagram of the first via-hole provided in the second insulating structure according to an embodiment of the present disclosure.

Figure 20:
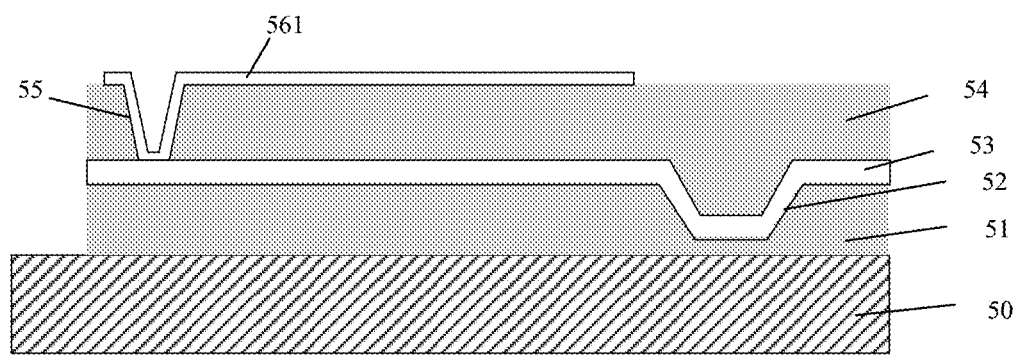
FIG. 20 is a schematic cross-sectional view of a first conductive layer formed according to an embodiment of the disclosure.

In step S106, a conductive layer may be deposited by a coating or plasma chemical vapor deposition process, and then an etching process is used to obtain a first conductive layer 561 with a target pattern, in some embodiments, the first conductive layer 561 covers a part of the upper surface of the second insulating structure 54 and covers the sidewall and the bottom surface of the first via-hole 55. Referring to FIG. 20, FIG. 20 is a schematic cross-sectional view of a first conductive layer according to an embodiment of the present disclosure. The first conductive layer 561 may be a first gate line layer, the second insulating structure 54 may include a PI layer 541, a buffer layer 542, and a first gate insulating layer 543, which are sequentially stacked, and as shown in FIG. 7, in step S104, the PI layer 541, the buffer layer 542, and the first gate insulating layer 543 may be sequentially deposited on the first wiring layer 53 by using a conventional deposition process such as coating, physical vapor deposition, or chemical vapor deposition.

In order to realize the connection with the wires in the display area, for example, the connection with the lead-out wire 57 led out from the display area, an interlayer dielectric layer 58 covering the first conductive layer 561 and the first gate insulating layer 543 may be further formed after step S106; the interlayer dielectric layer 58 is etched to form a third through-hole 59 in the interlayer dielectric layer 58, the lead-out trace 57 may cover a part of the interlayer dielectric layer 58 and fill the third through-hole 59, and contact the first conductive layer 561 under the third through-hole 59, so that the data signal line in the display area may be led to the first wiring layer 53 through the first conductive layer 561 and the first through-hole 55, as shown in FIG. 7.

In other embodiments, the first conductive layer 561 may cover a part of the upper surface of the second insulating structure 54 and fill the first via-hole 55, as shown in FIG. 6. In some embodiments, the first conductive layer 561 may be formed in synchronization with the source/drain electrode layer in the display area, wherein the second insulating structure 54 may include a PI layer, a buffer layer, a first gate insulating layer, a second gate insulating layer, and an interlayer dielectric layer stacked in sequence, and an upper surface of the first conductive layer 561 may be at the same level as an upper surface of the source/drain electrode layer in the display area, and correspondingly, in step S104, the PI layer, the buffer layer, the first gate insulating layer, the second gate insulating layer, and the interlayer dielectric layer may be sequentially deposited on the first wiring layer 53 by using a conventional deposition process such as coating, physical vapor deposition, or chemical vapor deposition.

The conductive structure may further include a plurality of conductive layers, and in some embodiments, step S106 may further include:
- depositing a first conductive layer 561, the first conductive layer 561 covering a part of the upper surface of the second insulating structure 54 and at least covering the sidewall and the bottom surface of the first via-hole 55, and contacting the first wiring layer 53 under the first via-hole 55;
- depositing a second insulating dielectric layer covering the first conductive layer 561 on the second insulating structure 54;
- depositing a second conductive layer 562, the second conductive layer 562 covering the second insulating dielectric layer and the second conductive layer 562 contacting the first conductive layer 561 within the first via-hole 55. The conductive structure 56 formed using this method can be seen in FIG. 8.

In other embodiments, after depositing the second insulating dielectric layer and before depositing the second conductive layer 562, a third conductive layer 563 and a third insulating dielectric layer may be sequentially deposited, where the third conductive layer 563 covers the second insulating dielectric layer, and contacts 5 the first conductive layer 561 and the second conductive layer 562 in the first via-hole 55, and the third insulating dielectric layer covers the second conductive layer 562 on the second insulating dielectric layer, as shown in FIG. 9.

Figure 21:
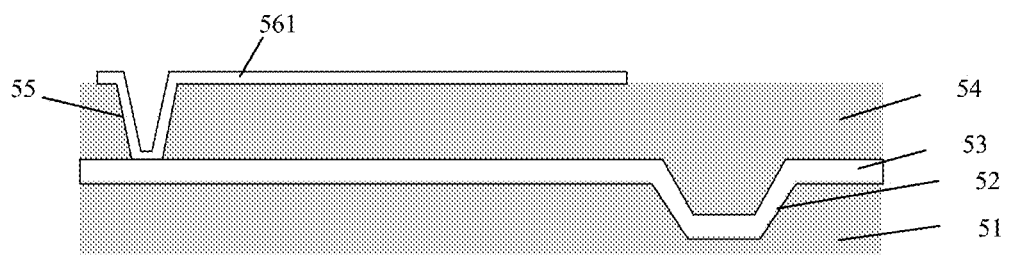
FIG. 21 is a schematic cross-sectional view of a display substrate after peeling the substrate.

In an embodiment of the present disclosure, after forming the display substrate, the method may further include:
- Step S107: peeling off the substrate 50, as shown in FIG. 21, and FIG. 21 shows a schematic cross-sectional structure of the display substrate after the substrate is peeled off.
- Step S108: forming a connection structure 71, where the connection structure 71 is arranged on a side of the first insulation structure 51 away from the second insulation structure 54, and contacts the first wiring layer 53 on the bottom surface of the first groove 52.

When the depth of the first groove 52 is equal to that of the first insulating structure 51, in step S108, a connection structure 71 may be formed on a surface of the first insulating structure 51 away from the second insulating structure 54, that is, a back surface of the first insulating structure 51 by coating or the like, where the connection structure 71 at least covers the first wiring layer 53 exposed after the substrate 50 is peeled off, as shown in FIG. 9.

In other embodiments, in order to avoid damage to the first wiring layer 53 when the substrate 50 is stripped, the first groove 52 having a depth smaller than that of the first insulating structure 51 is etched, so that in step S108, the following steps may be specifically performed:
- etching a side surface of the first insulating structure 51 away from the second insulating structure 54 to expose the first wiring layer 53 in the first groove 52;
- providing a connection structure 71 is provided, and a part of the connection structure 71 is provided within the first insulating structure 51 in contact with the first wiring layer 53.

Figure 22:
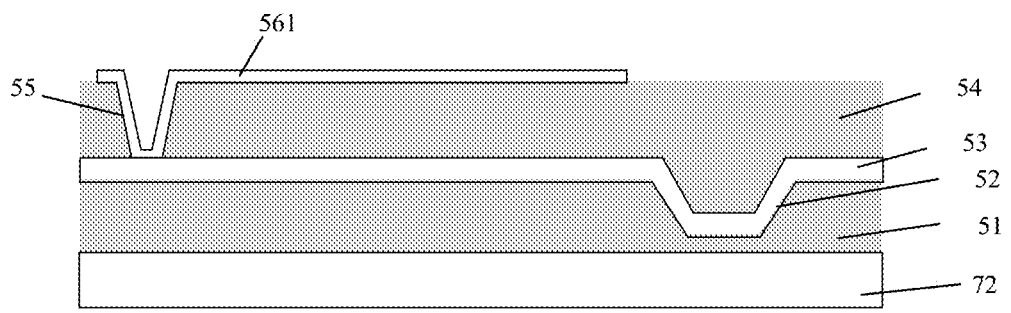
FIG. 22 is a schematic cross-sectional view of a display substrate provided with an insulating film layer according to an embodiment of the disclosure.
Figure 23:
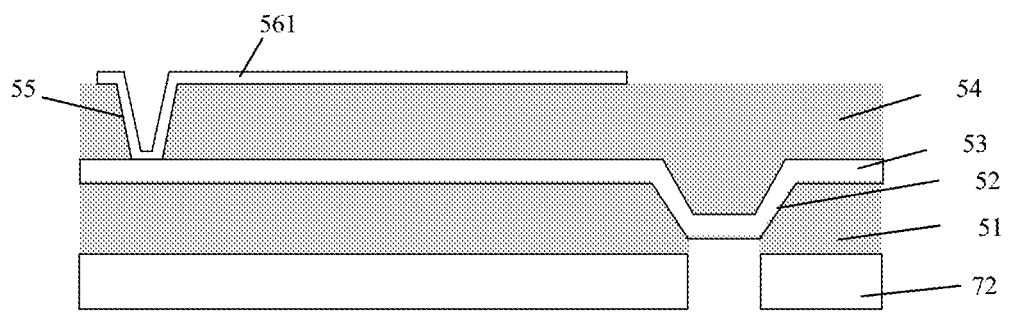
FIG. 23 is a schematic cross-sectional view of a display substrate according to an embodiment of the disclosure showing a first wiring layer exposed from a back surface of a first insulating structure.

Before etching a side surface of the first insulating structure 51 away from the second insulating structure 54, the method may further include:
- depositing an insulating film layer 72, where the insulating film layer 72 covers a side of the first insulating structure 51 away from the second insulating structure 54, which can be specifically seen in FIG. 22, where FIG. 22 shows a schematic cross-sectional structure diagram of a display substrate provided with an insulating film layer according to an embodiment of the present disclosure;
- etching the insulating film layer 72 to expose at least the first insulating structure 51 located at the position of the first groove 52, referring to FIG. 23, FIG. 23 is a schematic cross-sectional structure diagram of the display substrate provided by the embodiment of the disclosure and exposing the first wiring layer from the back of the first insulating structure.

Figure 24:
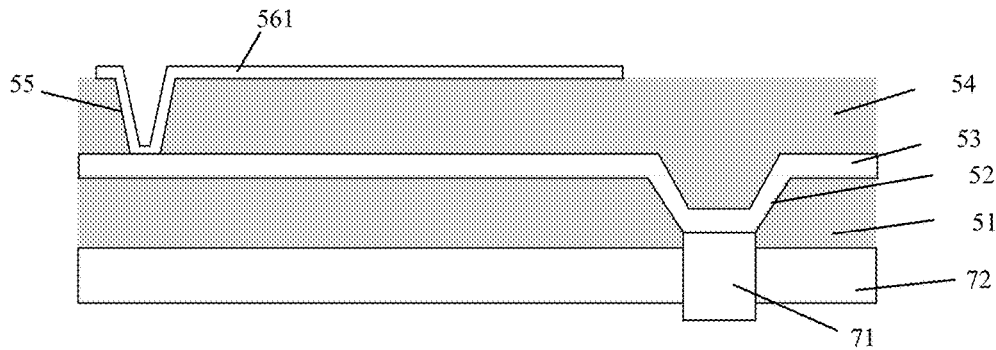
FIG. 24 is a schematic cross-sectional view of a display substrate according to an embodiment of the disclosure.

In some embodiments, a connection structure 71 may be further provided for connecting with an external circuit, which may be seen from FIG. 24, where FIG. 24 illustrates a schematic cross-sectional structure of a display substrate according to an embodiment of the present disclosure. The connection structure 71 may contact the chip on film layer 88, and the first wiring layer 53 is bound to the circuit board 89 through the connection structure 71 and the chip on film layer 88, as shown in FIG. 14.

The insulating film layer 72 may be made of a polymer material to protect the backside of the first insulating structure 51 from being damaged during the etching process. The etching of the insulating film 72 or the first insulating structure 51 may use a laser etching, dry etching, or wet etching process. It should be noted that, in other embodiments, the insulating film layer 72 covering a surface of a side portion of the first insulating structure 51 away from the second insulating structure 54 may also be directly deposited to expose the first insulating structure 51 at a position corresponding to the first groove 52.

Figure 25:
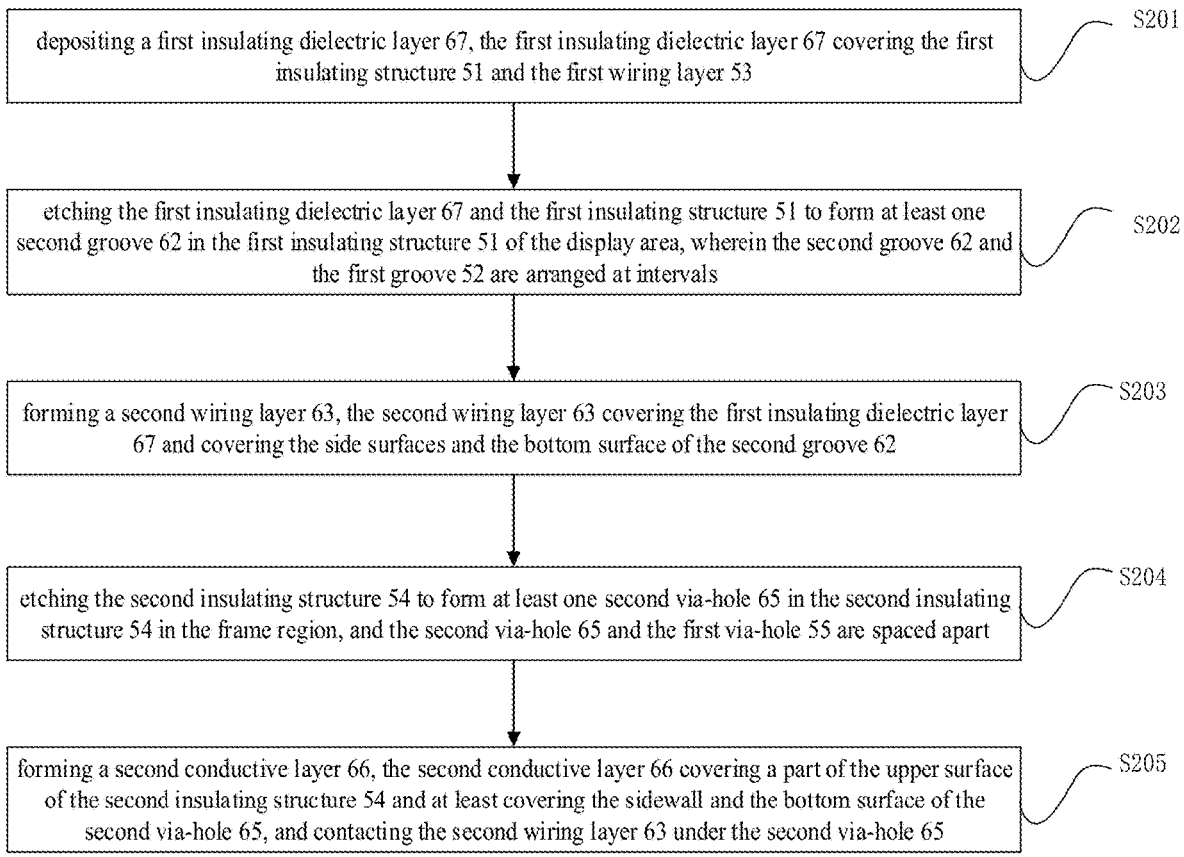
FIG. 25 shows a flowchart of a method of forming a display substrate with a second wiring layer formed according to an embodiment of the disclosure.

In the embodiment of the present disclosure, when the types of the data signals led out from the display area are different, the different types of data signals are respectively connected to the different conductive structures, and the connection with the corresponding wires in the wiring layer is realized through the different through-holes. Referring to FIG. 25, in a flowchart of a method of forming a display substrate with a second wiring layer formed thereon according to an embodiment of the present disclosure, after a first wiring layer 53 is formed on the first insulating structure 51, the method may further include:

Step S201: depositing a first insulating dielectric layer 67, the first insulating dielectric layer 67 covering the first insulating structure 51 and the first wiring layer 53.

Step S202: etching the first insulating dielectric layer 67 and the first insulating structure 51 to form at least one second groove 62 in the first insulating structure 51 of the display area, wherein the second groove 62 and the first groove 52 are arranged at intervals.

Step S203: forming a second wiring layer 63, the second wiring layer 63 covering the first insulating dielectric layer 67 and covering the side surfaces and the bottom surface of the second groove 62.

Step S204: etching the second insulating structure 54 to form at least one second via-hole 65 in the second insulating structure 54 in the frame region, and the second via-hole 65 and the first via-hole 55 are spaced apart.

Step S205: forming a second conductive layer 66, the second conductive layer 66 covering a part of the upper surface of the second insulating structure 54 and at least covering the sidewall and the bottom surface of the second via-hole 65, and contacting the second wiring layer 63 under the second via-hole 65.

In the embodiment of the present disclosure, the step S201 may specifically be depositing the first insulating dielectric layer 67 by using a physical vapor deposition process or a chemical vapor deposition process.

In step S202, the first insulating dielectric layer 67 and the first insulating structure 51 may be etched using a dry etching process or a wet etching process, and in some embodiments, the second groove 62 may be formed in the same manner as the first groove 61.

Steps S203 to S205 can be performed in the same manner as steps S103, S105, and S106, and for brevity, are not repeated herein, and refer to the above description specifically.

In the above method of forming a display substrate provided by the present disclosure, at least one first groove 52 is formed in the first insulating structure 51 of the display region by etching, a first wiring layer is formed on the first insulating structure 51 and covers the side surface and the bottom surface of the first groove 52, a second insulating structure 54 provided with at least one first through-hole 55 in the frame region is formed on the first wiring layer 53, and a first conductive structure 56 is formed to cover a part of the upper surface of the second insulating structure 54, cover at least the sidewall and the bottom surface of the first through-hole 55, and contact the first wiring layer 53 under the first through-hole 55. Through setting up first wiring layer 53 between first insulation structure 51 and second insulation structure 54, contact with first wiring layer 53 through first through-hole 55 by first conductive structure 56, and then can realize being connected with outside through first wiring layer 53, effectively reduced the wiring district and avoided the appearance of kink district, very big realization the narrowing of frame. In addition, for the display substrate which is arranged on the substrate 50 and provided with the first groove 52 with the depth smaller than the thickness of the first insulating structure 51, the substrate 50 can be stripped, and then the etching process is used for etching one side, away from the second insulating structure 54, of the first insulating structure 51 to expose the first wiring layer 53, so that the method can effectively avoid the situation that the first wiring layer 53 in the first groove 52 is in direct contact with the substrate 50, and the first wiring layer 53 is damaged when the substrate 50 is stripped.

Another aspect of the present disclosure also provides a method of forming a display device including a display substrate, which may be manufactured using the method of forming a display substrate as described above. The display device may further include a driving circuit layer, a planarization layer, a light emitting device, a pixel defining layer, and an encapsulation layer, where the driving circuit layer may include a driving transistor and a capacitor structure.

Although the embodiments disclosed in the present disclosure are described above, the descriptions are only for the convenience of understanding the present disclosure, and are not intended to limit the present disclosure. It will be understood by those skilled in the art of the present disclosure that various changes in form and details may be made therein without departing from the spirit and scope of the disclosure, and that the scope of the disclosure is to be limited only by the terms of the appended claims.

What is claimed is:

1. A display substrate, comprising:
   a first insulating structure, comprising a display area and a frame area, wherein the frame area is arranged around the display area, and at least one first groove is arranged in the first insulating structure of the display area;
   a first wiring layer arranged on the first insulating structure and covering a side surface and a bottom surface of the first groove, the first wiring layer extends from the frame area to the display area;
   a second insulating structure arranged on the first wiring layer, wherein at least one first via-hole is formed in the second insulating structure of the frame area; a part of the first wiring layer is located at a bottom surface of the first via-hole;
   a first conductive structure covering a part of an upper surface of the second insulating structure and at least a sidewall and the bottom surface of the first via-hole, and in contact with the first wiring layer under the first via-hole;
   wherein at least one second groove is arranged in the first insulating structure of the display area, and the second groove and the first groove are arranged at intervals;
   the display substrate further comprises a second wiring layer, wherein the second wiring layer is arranged on the first insulating structure and covers a side surface and a bottom surface of the second groove, the second wiring layer extends from the frame area to the display area, a first insulating dielectric layer is further arranged between the second wiring layer and the first insulating structure, and the first insulating dielectric layer covers the first insulating structure and the first wiring layer;

at least one second via-hole is further formed in the second insulating structure of the frame area, and the second via-hole and the first via-hole are arranged at intervals;

a second conductive structure covering a part of an upper surface of the second insulating structure and at least a sidewall and a bottom surface of the second via-hole, and in contact with the second wiring layer under the second via-hole;

the second conductive structure and the first conductive structure receive different types of signals.

2. The display substrate according to claim 1, further comprising a connection structure arranged at a side of the first insulating structure away from the second insulating structure and in contact with the first wiring layer on the bottom surface of the first groove.

3. The display substrate according to claim 2, wherein a depth of the first groove is less than or equal to a thickness of the first insulating structure, and when the depth of the first groove is less than the thickness of the first insulating structure, a part of the connection structure is arranged within the first insulating structure and in contact with the first wiring layer.

4. The display substrate according to claim 1, wherein the first conductive structure comprises a first conductive layer filling the first via-hole.

5. The display substrate according to claim 1, wherein the first conductive structure comprises a first conductive layer and a second conductive layer arranged in a stacked manner, the first conductive layer is in contact with the second conductive layer within the first via-hole, and a second insulating dielectric layer is arranged between the first conductive layer and the second conductive layer on the second insulating structure.

6. The display substrate according to claim 5, wherein a third conductive layer is further arranged between the first conductive layer and the second conductive layer, the first conductive layer, the third conductive layer and the second conductive layer in the first via-hole are in contact with each other, a third insulating dielectric layer is arranged between the first conductive layer and the third conductive layer on the second insulating structure, and the second insulating dielectric layer is arranged between the third conductive layer and the second conductive layer.

7. A display device comprising the display substrate according to claim 1.

8. The display device according to claim 7, further comprising a chip on film layer and a circuit board, the chip on film layer being in contact with the connection structure in the display substrate, the first wiring layer in the display substrate being bound to the circuit board through the connection structure and the chip on film layer.

9. The display device according to claim 7, further comprising a connection structure arranged at a side of the first insulating structure away from the second insulating structure and in contact with the first wiring layer on the bottom surface of the first groove.

10. The display device according to claim 9, wherein a depth of the first groove is less than or equal to a thickness of the first insulating structure, and when the depth of the first groove is less than the thickness of the first insulating structure, a part of the connection structure is arranged within the first insulating structure and in contact with the first wiring layer.

11. A method of forming a display substrate, configured to form the display substrate according to claim 1, wherein the method comprises:

providing a first insulating structure, wherein the first insulating structure comprises a display area and a frame area, and the frame area is arranged around the display area;

etching the first insulating structure to form at least one first groove in the first insulating structure of the display area;

forming a first wiring layer on the first insulating structure, the first wiring layer covering a part of the first insulating structure and a side surface and a bottom surface of the first groove, the first wiring layer extends from the frame area to the display area;

forming a second insulating structure on the first wiring layer;

etching the second insulating structure to form at least one first via-hole in the second insulating structure of the frame area; a part of the first wiring layer is located at a bottom surface of the first via-hole; and forming a first conductive structure which covers a part of an upper surface of the second insulating structure and at least a side wall and the bottom surface of the first via-hole and is in contact with the first wiring layer under the first via-hole;

wherein subsequent to the forming the first wiring layer on the first insulating structure, the method further comprises:

depositing a first insulating dielectric layer, wherein the first insulating dielectric layer covers the first insulating structure and the first wiring layer;

etching the first insulating dielectric layer and the first insulating structure to form at least one second groove in the first insulating structure of the display area, wherein the second groove and the first groove are arranged at intervals;

forming a second wiring layer, wherein the second wiring layer covers the first insulating dielectric layer and covers a side surface and a bottom surface of the second groove, the second wiring layer extends from the frame area to the display area;

etching the second insulating structure to form at least one second via-hole in the second insulating structure of the frame area, wherein the second via-hole and the first via-hole are arranged at intervals; and forming a second conductive layer which covers part of an upper surface of the second insulating structure and at least covers a side wall and a bottom surface of the second via-hole and is in contact with the second wiring layer under the second via-hole;

the second conductive structure and the first conductive structure receive different types of signals.

12. The method according to claim 11, wherein the first insulating structure is arranged on a substrate, the method further comprises:

peeling off the substrate; and forming a connection structure, wherein the connection structure is arranged on a side of the first insulating structure away from the second insulating structure and is in contact with the first wiring layer on the bottom surface of the first groove.

13. The method according to claim 12, wherein a depth of the first groove is less than or equal to a thickness of the first insulating structure, and when the depth of the first groove is less than the thickness of the first insulating structure, the forming the connection structure comprises:

etching the surface at a side, away from the second insulating structure, of the first insulating structure to expose the first wiring layer in the first groove;

arranging the connection structure, wherein a part of the connection structure is arranged in the first insulating structure and in contact with the first wiring layer.

14. The method according to claim 13, wherein prior to the etching the surface at the side, away from the second insulating structure, of the first insulating structure to expose the first wiring layer in the first groove, the method further comprises:
depositing an insulating film layer, wherein the insulating film layer covers a side of the first insulating structure away from the second insulating structure; and
etching the insulating film layer to at least expose the first insulating structure at the position of the first groove.

15. The method according to claim 11, wherein the forming the first conductive structure comprises:
depositing a first conductive layer covering a part of the upper surface of the second insulating structure and at least a sidewall and a bottom surface of the first via-hole, and in contact with the first wiring layer under the first via-hole;
depositing a second insulating dielectric layer, wherein the second insulating dielectric layer covers the first conductive layer on the second insulating structure; and
depositing a second conductive layer, wherein the second conductive layer covers the second insulating dielectric layer and is in contact with the first conductive layer in the first via-hole.

16. The method according to claim 15, wherein subsequent to the depositing the second insulating dielectric layer and prior to the depositing the second conductive layer, the method further comprises: depositing a third conductive layer and a third insulating dielectric layer in sequence, wherein the third conductive layer covers the second insulating dielectric layer and is in contact with the first conductive layer and the second conductive layer in the first via-hole, and the third insulating dielectric layer covers the second conductive layer on the second insulating dielectric layer.

17. A method of forming a display device, wherein the display device comprises a display substrate manufactured using the method of forming a display substrate according to claim 11.

* * * * *